(12) United States Patent
Zhang

(10) Patent No.: US 8,441,172 B2
(45) Date of Patent: May 14, 2013

(54) NONLINEAR OSCILLATOR FOR VIBRATION ENERGY HARVESTING

(75) Inventor: Chunbo Zhang, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 60 days.

(21) Appl. No.: 12/911,180

(22) Filed: Oct. 25, 2010

(65) Prior Publication Data

US 2011/0095648 A1    Apr. 28, 2011

Related U.S. Application Data

(60) Provisional application No. 61/254,801, filed on Oct. 26, 2009.

(51) Int. Cl.
*H01L 41/113* (2006.01)

(52) U.S. Cl.
USPC .................. 310/339; 310/311; 310/319

(58) Field of Classification Search .......... 310/339, 310/311, 319
See application file for complete search history.

(56) References Cited

U.S. PATENT DOCUMENTS

| 7,084,554 | B2* | 8/2006 | Xu et al. .......... 310/332 |
| 7,847,469 | B2* | 12/2010 | Nakamura et al. ........ 310/330 |
| 2006/0045460 | A1* | 3/2006 | Sangawa et al. ......... 385/147 |
| 2008/0079333 | A1* | 4/2008 | Ulm et al. .......... 310/339 |
| 2008/0136562 | A1* | 6/2008 | Kulah et al. .......... 333/186 |
| 2008/0277941 | A1* | 11/2008 | Bowles et al. ......... 290/54 |
| 2009/0261689 | A1* | 10/2009 | Fang .................. 310/319 |

* cited by examiner

*Primary Examiner* — Walter Benson
*Assistant Examiner* — Bryan Gordon
(74) *Attorney, Agent, or Firm* — Ingrassia Fisher & Lorenz, P.C.

(57) ABSTRACT

An oscillator apparatus and method for vibration energy harvesting includes a nonlinear oscillator (e.g. piezoelectric, magnetic or liquid oscillator) configured in association with a potential energy profile to enhance a desirable nonlinear effect with a larger displacement and a wider spectrum response. A cantilever beam associated with a vibrating structure generates a mechanical energy in response to vibration forces. A mechanical-to-electrical power converter can be coupled to the nonlinear oscillator to convert the mechanical power into an electrical power. The frequency response of the nonlinear oscillator adapts to varying ambient vibrations and auto-tunes with respect to the ambient vibration change for wireless and MEMS applications.

12 Claims, 4 Drawing Sheets

NONLINEAR OSCILLATOR FOR VIBRATION ENERGY HARVESTING

CROSS-REFERENCE TO PROVISIONAL APPLICATION

This patent application claims priority to U.S. Provisional Patent Application No. 61/254,801, filed on Oct. 26, 2009 entitled "Nonlinear Oscillator for Vibration Energy Harvesting," and which is hereby incorporated by reference in its entirety.

TECHNICAL FIELD

Embodiments are generally related to micro power systems and methods. Embodiments are also related to energy harvesting devices and techniques. Embodiments are additionally related to nonlinear oscillators. Embodiments are further related to harvesting vibration energy.

BACKGROUND OF THE INVENTION

Wireless sensor networks typically include spatially distributed devices associated with sensors that remotely transmit and receive data over a network. The relayed information can be employed to monitor both physical and environmental conditions such as, for example, temperature, location, and pressure. Such wireless sensor networks can be powered by a variety of power sources such as a battery. Batteries are a cost effective, ubiquitous, and commonly known powering technology. The specific drawbacks of batteries, however, include finite lifetime, replacement cost, and disposal concerns. Additionally, sensor nodes tend to be portable and integrated with multi-functions; therefore, limited power issues, small size and integration capabilities pose additional problems to the effective implementation of a promising wireless sensor network.

Energy harvesting (or energy scavenging) provide a useful way to power electronic devices without the need for batteries or electrical wiring. Energy harvesting can be defined as the conversion of ambient energy (e.g., mechanical/vibration, thermal, light/radiation energy, etc.) into usable electrical energy. Several technologies exist to extract energy from the environment such as, for example, solar, thermal, kinetic energy, and vibration energy. Conventional energy harvesting devices utilize a linear harvester for generating electrical power from vibrations, oscillations or other mechanical motions. Linear oscillators, however, generate significant power within a narrow band around resonance and the power is limited by intrinsic damping factor and the driving force at resonant frequency. Such prior art devices implementing linear (resonant) oscillator have not been able to generate enough power density and only achieve 10-100 μW/cc or less at 0.5 g acceleration.

Based on the foregoing it is believed that a need exists for an improved nonlinear energy harvester apparatus and method with an optimal potential energy profile. A need also exists for an improved nonlinear oscillator apparatus and method for harvesting vibration energy, as described in greater detail herein.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved energy harvesting devices and methods.

It is another aspect of the disclosed embodiments to provide for an improved nonlinear oscillator with an optimal potential energy profile.

It is further aspect of the disclosed embodiments to provide for an improved nonlinear oscillator apparatus and method for vibration energy harvesting.

The aforementioned aspects and other objectives and advantages can now be achieved as described herein. An oscillator apparatus and method for vibration energy harvesting is disclosed herein. A nonlinear oscillator (e.g. piezoelectric, magnetic or liquid oscillator) can be configured in association with a potential energy profile to enhance a desirable nonlinear effect with a larger displacement and a wider spectrum response. A cantilever beam associated with a vibrating structure (e.g., a magnetic, piezoelectric or electrode structure) generates a mechanical energy in response to vibration forces. A mechanical-to-electrical power converter (e.g., a piezoelectric, an electromagnetic converter) can be coupled to the nonlinear oscillator to convert the mechanical power into an electrical power. The frequency response of the nonlinear oscillator adapts to varying ambient vibrations and auto-tunes with respect to the ambient vibration change for wireless and MEMS applications.

The potential energy profile can be configured with a combination of elastic, magnetic and electrical potential energies. The nonlinear oscillator apparatus can be adapted to wide and varying environmental spectra and provide an increased amount of electrical energy across a wide vibration spectrum. The nonlinear oscillator can be fabricated utilizing MEMS fabrication techniques. The nonlinear oscillator may also be assembled from machined components of beams, coils, magnets, or piezoelectric layers. Such nonlinear oscillator apparatus provides a long-life maintenance-free wireless sensor system in battlefields, ships, airplanes, buildings and so forth.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate at least one embodiment and are not intended to limit the scope thereof.

Figure 1:
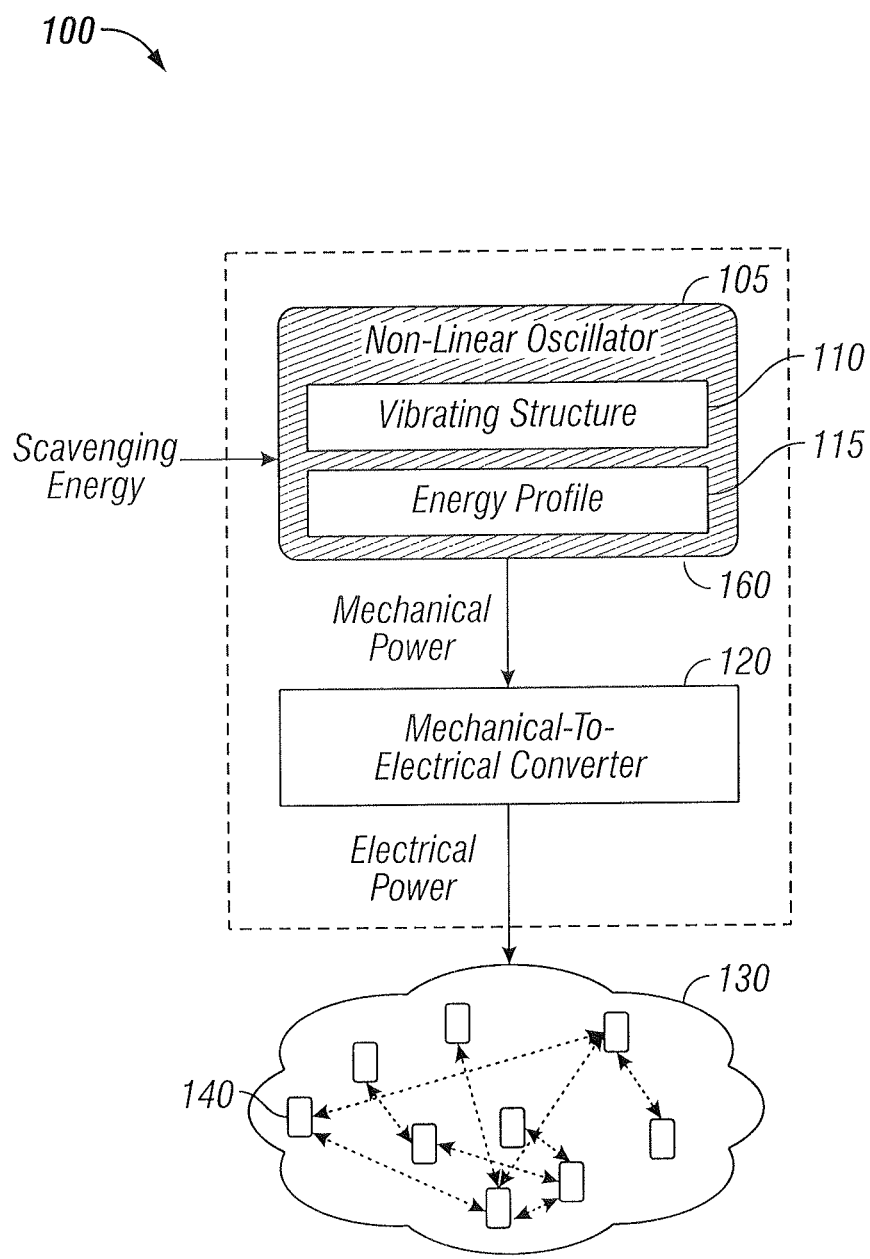
FIG. 1 illustrates a block diagram of a nonlinear oscillator apparatus for vibration energy harvesting, in accordance with the disclosed embodiments.

FIG. 1 illustrates a block diagram of a nonlinear oscillator apparatus 100 for vibration energy harvesting, in accordance with the disclosed embodiments. The disclosed embodiments function in a completely nonlinear deflection regime that permits for the extraction of significant power even at lower frequencies. The nonlinear oscillator apparatus 100 can be coupled to a wireless sensor network 130 for providing power to electronic devices 140 associated with the wireless sensor network 130 without the need for batteries or electrical wiring. The apparatus 100 generally includes a nonlinear oscillator 105 configured to exhibit a potential energy profile 115 that enhances a desirable nonlinear effect with a larger displacement and a relatively wider spectrum response.

The nonlinear oscillator 105 further includes a vibrating structure 110 that is configured to generate mechanical energy in response to vibration forces. The vibrating structure 110 can be, for example, a piezoelectric structure, a magnetic structure (Duffing oscillator) or a liquid capacitive structure, depending upon design considerations. A mechanical-to-electrical converter 120 is preferably coupled to the nonlinear oscillator 105 and is configured to convert the mechanical power into an electrical power. The mechanical-to-electrical power converter 120 described herein can be, for example, a piezoelectric converter or an electromagnetic converter, depending upon design considerations. It will be appreciated that other types of mechanical-to-electrical converters may be used.

The nonlinear oscillator apparatus 100 can be employed in wide and varying environmental spectra. The frequency response of the nonlinear oscillator 100 can be adapted to varying ambient vibrations and auto-tunes to variations in ambient vibrations. The potential energy profile 115 may be configured from a combination of energy sources such as, for example, elastic, magnetic and/or electrical potential energies again depending upon design considerations. The nonlinear oscillator 105 can be fabricated utilizing micro-electromechanical (MEMS) fabrication technologies (e.g. meso and micro-scale device technologies). The disclosed nonlinear oscillator 105 may also be assembled from machined components of beams, coils, magnets, or piezoelectric layers.

Figure 2:
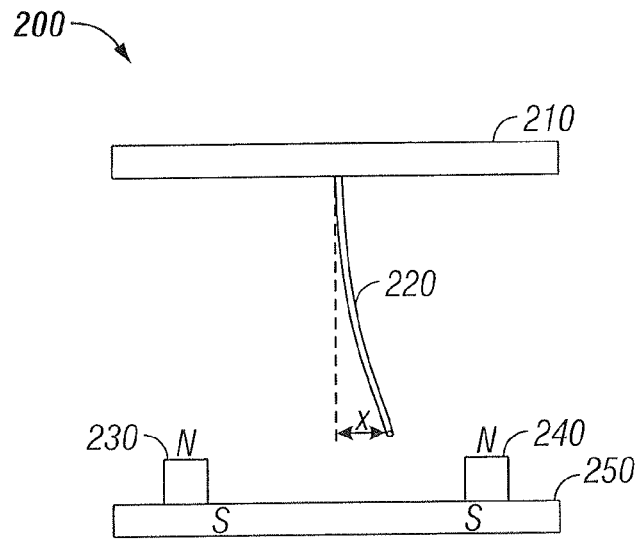
FIG. 2 illustrates a perspective view of a Duffing oscillator for vibration energy harvesting, in accordance with the disclosed embodiments.

FIG. 2 illustrates a perspective view of an electromagnetic oscillator 200 for vibration energy harvesting, in accordance with the disclosed embodiments Note that in FIGS. 1-6, identical or similar blocks are generally indicated by identical reference numerals. The electromagnetic oscillator 200 can be for example, a Duffing oscillator, which is a periodically forced oscillator with a nonlinear elasticity. The nonlinearity can be generated by a particular arrangement of a pair of magnets 230 and 240 in conjunction with a base 250. The nonlinear electromagnetic oscillator 200 includes a cantilever beam 220 operatively coupled to a rigid support 210. The cantilever beam 220 may be configured from a material such as, for example, steel, depending upon design considerations. It can be appreciated that other types of materials may be utilized in place of the suggested material. The cantilever beam 220 oscillates between the pair of magnets 230 and 240 in order to generate vibration energy with respect to the oscillator 200. The magnets 230 and 240 are preferably coupled to the base 250, and are used to establish the potential energy profile 115 in the oscillator structure 200. The vibration energy can be further converted to the electrical power utilizing the mechanical-to-electrical converter 120.

Figure 3:
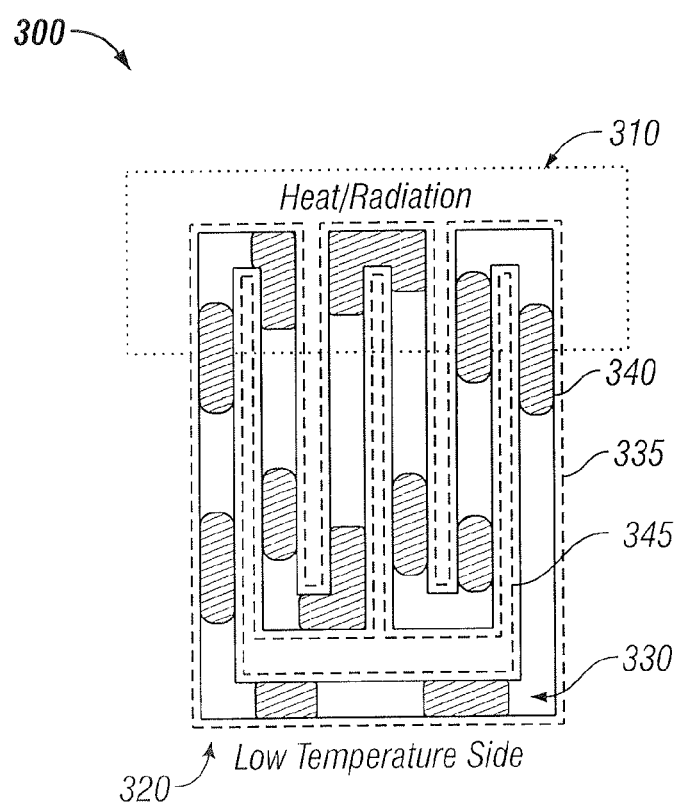
FIG. 3 illustrates a perspective view of a liquid capacitive harvester, in accordance with the disclosed embodiments.

FIG. 3 illustrates a perspective view of a liquid capacitive harvester 300, in accordance with the disclosed embodiments. The liquid capacitive harvester 300 includes a pulsating heat pipe 330 that can be employed for thermal and vibration energy co-harvesting applications. The heat pipe 330 can be coated with an array of positive electrode 335 and negative electrode 345, where the flowing liquid can function as a dielectric medium. The heat pipe 330 can further include a high temperature region 310 and a low temperature region 320. The liquid medium 340 can vibrate within the pipe 330 in response to ambient vibration. The liquid medium 340 can also flow between the high and low temperature regions 310 and 320 resulting from the temperature gradient. The movement of the liquid 340 within the heat pipe 330 generates sufficient vibrations or flow in the pipe 330 in order to generate the mechanical power with respect to the liquid capacitive harvester 300. Such mechanical power can be further converted to the electrical power utilizing the mechanical-to-electrical converter 120, which in this example is a capacitive converter comprised of the electrodes 335 and 345.

Figure 4:
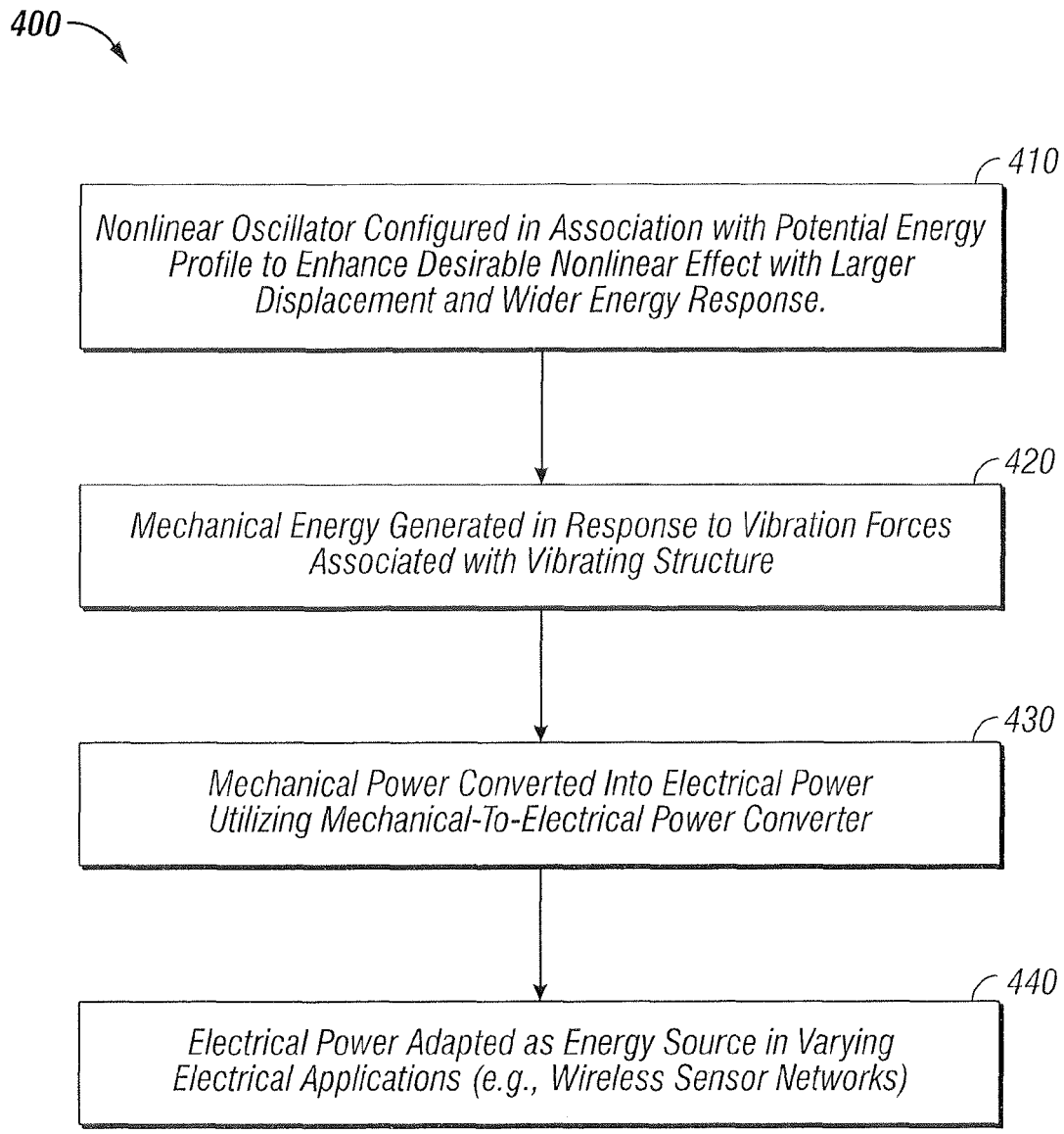
FIG. 4 illustrates a high level flow chart of operation illustrating logical operational steps of a method for harvesting vibration energy utilizing a nonlinear oscillator, in accordance with the disclosed embodiments.

FIG. 4 illustrates a high level flow chart of operation illustrating logical operation steps of a method 400 for harvesting vibration energy, in accordance with the disclosed embodiments. The nonlinear oscillator 105 can be configured in association with (e.g., to exhibit) the potential energy profile 115 to enhance a desirable nonlinear effect with a larger displacement and a wider spectrum response, as depicted at block 410. The mechanical energy can be generated in response to vibration forces associated with the vibrating structure 110, as depicted at block 420. The mechanical power can be converted into the electrical power utilizing the mechanical-to-electrical power converter 120, as indicated at block 430. The electrical power can be adapted as the energy source in varying electrical applications such as the wireless sensor networks 130, as illustrated at block 440. The nonlinear oscillator based vibration energy harvesting approach disclosed herein provides a long life maintenance free power solution for wireless sensor networks and systems in battlefields, ships, airplanes, buildings and so forth.

Figure 5:
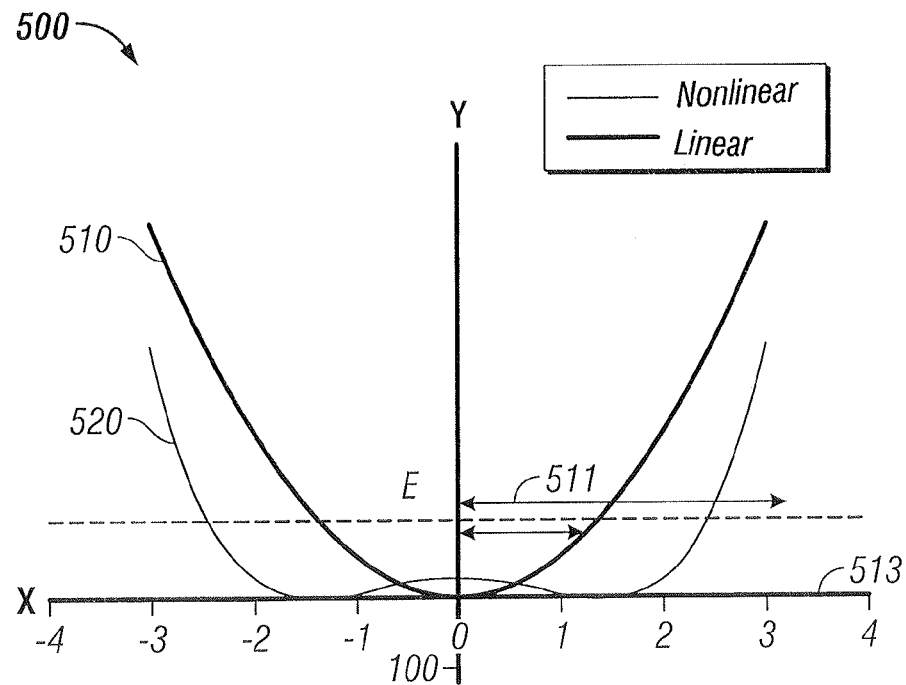
FIG. 5 illustrates a graphical representation of potential energy profiles with respect to the nonlinear and a linear oscillator, in accordance with the disclosed embodiments.

FIG. 5 illustrates a graphical representation 500 of the potential energy profile of the nonlinear oscillator 105 of FIG. 1, and of a linear oscillator. Again as reminder, in FIGS. 1-6, identical or similar blocks are generally indicated by identical reference numerals. The curve 510 represents the potential energy profile with respect to a linear oscillator, whereas the curve 520 represents the potential energy profile 115 with respect to the nonlinear oscillator 105. The threshold line 511, which is parallel to the x-axis 513, illustrates the energy (E) threshold with respect to the oscillators. The general equation for an oscillator can be represented as shown in the following equation:

$$m\frac{d^2x}{dt^2} = -\frac{dU(x)}{dx} + F_{damp} + F_{vibration} \tag{1}$$

Where $U(x)$ represents the potential energy of the oscillator 105, $F_{damp}$ represents the damping force and $F_{vibration}$ is the driving force from vibration. Further, the equation for the linear oscillator can be represented as follows:

$$\frac{dU(x)}{dx} = Kx, F_{damp} = -C\frac{dx}{dt} \quad (2)$$

From equation (2), the electromagnetic harvester 200 and a piezoelectric harvester can be approximated as linear oscillators, with frequency dependent damping. Similarly, the equation for the nonlinear oscillator 105 can be represented as follows:

$$\frac{dU(x)}{dx} \neq Kx, \quad (3)$$

The nonlinearity with respect to the oscillator 100 can be introduced by a nonlinear damping. The maximum harvested power (instantaneous) with respect to the nonlinear oscillator 105 can be represented as follows:

$$P(t) = F_{damp}V, V = \frac{dx}{dt} \quad (4)$$

The energy equation for the oscillator can be written as shown in equation (7).

$$E = \frac{1}{2} mV^2 + U(x) \quad (5)$$

From equation (5), the energy (E) of the linear oscillator can be represented as follows:

$$E = \frac{1}{2} mV^2 + \frac{1}{2} Kx^2 \quad (6)$$

Similarly, the energy (E) of a Duffing-type nonlinear oscillator 100 can be represented as follows:

$$E = \frac{1}{2} mV^2 + \frac{1}{2}(K+b)x^2 + \frac{1}{4}\alpha x^4 \quad (7)$$

Where b and α are constants from the magnetic potential energy profile 115. From equation (6) and (7), the displacement provided by the nonlinear energy profile 115 at the same oscillator energy E can be more (e.g., 2-4 times) than the linear energy profile.

Figure 6:
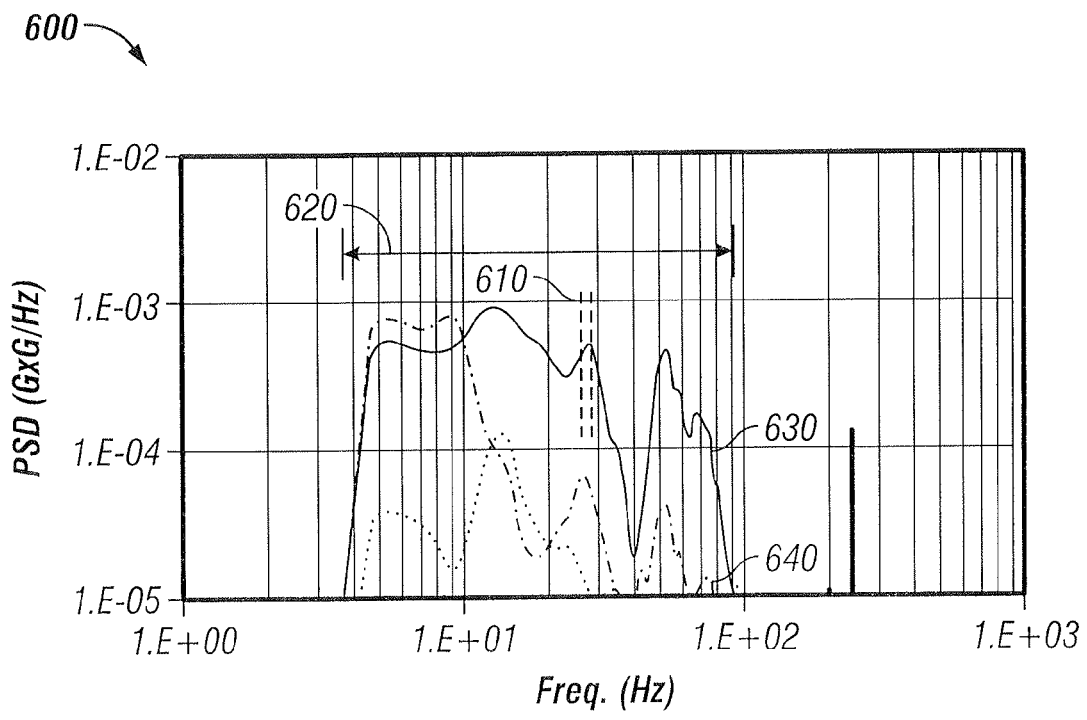
FIG. 6 illustrates a graphical representation of vibration spectrums with respect to the linear and the nonlinear oscillators, in accordance with the disclosed embodiments.

FIG. 6 illustrates a graph 600 depicting vibration spectrums 630 and 640 with respect to the linear oscillator and the nonlinear oscillator 100 respectively, in accordance with the disclosed embodiments. The dotted lined region 610 represents the energy spectra that can be effectively captured by the linear oscillator and which are at or near the oscillator's resonance. The curve 620 depicts the wide range energy spectra that can be effectively captured by the nonlinear oscillator 100. The nonlinear oscillator 100 can absorb energy from spectra much wider than the linear oscillator thereby potentially leading to a total stored energy (E) much higher than the linear oscillator. Combining with the capability of larger displacement at the same E, the nonlinear oscillator 100 in association with the potential energy profile 115 can achieve power density greater (for example 2-10× times) than the linear oscillator. The numerical nonlinear equations for nonlinear oscillator 100 that are required to optimize the energy capture and the potential energy profile can be represented as follows:

$$m\frac{d^2x}{dt^2} = -\frac{dU(x)}{dx} + F_{damp} + F_{vibration} \quad (8)$$

$$\frac{d^2x}{dt^2} = -(K+b)x - \gamma\frac{dx}{dt} - \alpha x^3 + F_{vibration} \quad (9)$$

Such an approach can be effectively utilized in a wider range of wireless sensor applications such as, for example, but not limited to ground-level agricultural sensors, HVAC and energy management sensors, automated gauge and meter reading, structural health monitoring, location tracking, distributed pollution sensors, and rotational equipment sensors.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. An oscillator apparatus for vibration energy harvesting, said apparatus comprising:
   a mechanical-to-electrical power converter coupled to receive mechanical energy and configured to convert said mechanical energy into electrical energy; and
   a nonlinear oscillator coupled to the mechanical-to-electrical power converter, the nonlinear oscillator configured to exhibit a nonlinear potential energy profile to thereby enhance a desirable nonlinear effect with a larger displacement and a wider spectrum response, wherein the nonlinear oscillator includes:
   a vibrating structure that generates mechanical energy in response to a vibration force or a thermal gradient.

2. The apparatus of claim 1 wherein said vibrating structure comprises a MEMS-based cantilever beam.

3. The apparatus of claim 1 wherein said vibrating structure comprises a piezoelectric structure.

4. The apparatus of claim 1 wherein said vibrating structure comprises a magnetic structure.

5. The apparatus of claim 1 wherein said vibrating structure comprises an electrode structure.

6. The apparatus of claim 1 wherein said mechanical-to-electrical power converter comprises a piezoelectric converter.

7. The apparatus of claim 1 wherein said mechanical-to-electrical power converter comprises an electromagnetic converter.

8. The apparatus of claim 1 wherein said nonlinear potential energy profile includes data indicative of elastic energy.

9. The apparatus of claim 1 wherein said potential energy profile includes data indicative of magnet energy.

10. The apparatus of claim 1 wherein said potential energy profile includes data indicative of potential energy.

11. The apparatus of claim 1 wherein said potential energy profile includes data indicative at least one of the following:
    an elastic energy;
    a magnetic energy; and
    a potential energy.

12. The apparatus of claim 1 wherein said vibrating structure comprises a liquid harvester structure, said liquid harvester structure including a liquid medium that vibrates within a pipe structure in response to ambient vibration.

* * * * *